United States Patent
Lee et al.

(10) Patent No.: US 8,664,019 B2
(45) Date of Patent: Mar. 4, 2014

(54) VERTICAL GROUP III-NITRIDE LIGHT EMITTING DEVICE AND METHOD FOR MANUFACTURING THE SAME

(75) Inventors: Jae Hoon Lee, Kyungki-do (KR); Yong Chun Kim, Kyungki-do (KR); Hyung Ky Back, Kyungki-do (KR); Moon Heon Kong, Kyungki-do (KR); Dong Woo Kim, Choongcheongbook-do (KR)

(73) Assignee: Samsung Electronics Co., Ltd., Seoul (KR)

(*) Notice: Subject to any disclaimer, the term of this patent is extended or adjusted under 35 U.S.C. 154(b) by 807 days.

(21) Appl. No.: 12/271,464

(22) Filed: Nov. 14, 2008

(65) Prior Publication Data

US 2009/0075412 A1    Mar. 19, 2009

Related U.S. Application Data

(63) Continuation of application No. 11/398,713, filed on Apr. 6, 2006, now abandoned.

(30) Foreign Application Priority Data

Apr. 7, 2005    (KR) .................. 10-2005-0029044

(51) Int. Cl.
    *H01L 33/00*    (2010.01)
(52) U.S. Cl.
    USPC .................. 438/29; 257/95; 257/E33.074
(58) Field of Classification Search
    USPC .................................. 257/95, 98
    See application file for complete search history.

(56) References Cited

U.S. PATENT DOCUMENTS

| | | | |
|---|---|---|---|
| 6,455,340 B1 | 9/2002 | Chua et al. | |
| 6,458,612 B1 | 10/2002 | Chen et al. | |
| 6,649,939 B1 * | 11/2003 | Wirth | 257/95 |
| 6,987,613 B2 * | 1/2006 | Pocius et al. | 359/565 |
| 7,189,591 B2 * | 3/2007 | Suehiro et al. | 438/29 |
| 7,470,938 B2 * | 12/2008 | Lee et al. | 257/103 |
| 7,977,695 B2 * | 7/2011 | Shim et al. | 257/98 |
| 2001/0002048 A1 | 5/2001 | Koike et al. | |
| 2002/0056847 A1 | 5/2002 | Uemura et al. | |

(Continued)

FOREIGN PATENT DOCUMENTS

| | | |
|---|---|---|
| JP | 9-092878 | 4/1997 |
| JP | 11-145511 | 5/1999 |

(Continued)

OTHER PUBLICATIONS

Japanese Office Action issued in Japanese Patent Application No. 2006-103246, mailed Jun. 23, 2009.

(Continued)

*Primary Examiner* — Benjamin Sandvik
(74) *Attorney, Agent, or Firm* — McDermott Will & Emery LLP

(57) ABSTRACT

A vertical group III-nitride light emitting device and a manufacturing method thereof are provided. The light emitting device comprises: a conductive substrate; a p-type clad layer stacked on the conductive substrate; an active layer stacked on the p-type clad layer; an n-doped $Al_xGa_yIn_{1-x-y}N$ layer stacked on the active layer; an undoped GaN layer stacked on the n-doped layer; and an n-electrode formed on the undoped GaN layer. The undoped GaN layer has a rough pattern formed on a top surface thereof.

12 Claims, 10 Drawing Sheets

(56) References Cited

U.S. PATENT DOCUMENTS

| | | | |
|---|---|---|---|
| 2002/0195609 | A1 | 12/2002 | Yoshitake et al. |
| 2003/0085851 | A1 | 5/2003 | Horng et al. |
| 2003/0218179 | A1* | 11/2003 | Koide et al. ............ 257/95 |
| 2004/0016936 | A1 | 1/2004 | Tanaka et al. |
| 2004/0033638 | A1* | 2/2004 | Bader et al. ............ 438/46 |
| 2004/0061119 | A1 | 4/2004 | Inoue et al. |
| 2006/0220029 | A1 | 10/2006 | Ishikazi |

FOREIGN PATENT DOCUMENTS

| | | |
|---|---|---|
| JP | 2000-138396 | 5/2000 |
| JP | 2004-186268 | 7/2004 |
| JP | 2004-296796 | 10/2004 |
| JP | 2005-005557 | 1/2005 |

OTHER PUBLICATIONS

Morita, D., et al. "Watt-Class High-Output-Power 365nm Ultraviolet Light-Emitting Diodes" Japanese Journal of Applied Physics 2004, vol. 43, No. 9A, pp. 5945-5950.

Taiwanese Examination Report, w/ English translation thereof, issued in Patent Application No. 095111913 dated on Jul. 29, 2008.

Daisuke Morita, et al., Watt-Class High-Out-Power 365 nm Ultraviloet Light-Emitting Diodes, Japanese Journal of Applied Physics, vol. 43, No. 9A, 2004, pp. 5945-5950.

Office Action issued in Japanese Patent Application No. 2010-232627, dated Feb. 19, 2013.

Japanese Patent Court Decision, issued in Japanese Patent Application No. 2006-103246, dated Dec. 6, 2011.

Japanese Office Action, and English translation thereof, issued in Japanese Patent Application No. 2010-232627 dated Jun. 26, 2012.

* cited by examiner

VERTICAL GROUP III-NITRIDE LIGHT EMITTING DEVICE AND METHOD FOR MANUFACTURING THE SAME

RELATED APPLICATION

This application is a Continuation of U.S. application Ser. No. 11/398,713, filed Apr. 6, 2006, now abandoned claims the benefit of Korean Patent Application No. 2005-29044 filed on Apr. 7, 2005 in the Korean Intellectual Property Office, the entire contents of each of which are incorporated herein by reference.

BACKGROUND OF THE INVENTION

1. Field of the Invention

The present invention relates to a group III-nitride light emitting device and a manufacturing method thereof. More particularly, the present invention relates to a vertical group III-nitride light emitting device improved in light extraction efficiency, and a manufacturing method thereof.

2. Description of the Related Art

Since development of a light emitting diode (LED) including a group III-nitride semiconductor, it has been utilized as a light source in a variety of areas such as a liquid crystal display (LCD) backlight, a mobile phone keypad, a illumination lighting source and the like. Regarding development of the LED for wide-ranging purposes, light-emitting efficiency and heat releasing properties thereof have emerged as a significant factor. Light-emitting efficiency of the LED is determined by light generation efficiency, external extraction efficiency and amplification efficiency by fluorescent material. Most of all, the biggest problem concerns low external extraction efficiency, that is, light generated is externally extracted at a low efficiency. The greatest hurdle against light extraction out of the LED is extinction of light resulting from total internal reflection. That is, big refractivity differences at an interface of the LED allows only about 20% of light generated to exit outside the interface of the LED. The light totally reflected at the interface travels inside the LED and is reduced to heat. This increases a heat release rate of the LED, and decreases external extraction efficiency of the LED, thus shortening lifetime thereof.

To overcome this problem, suggestions have been made regarding methods for improving external extraction efficiency. For example, a surface pattern or a surface texture is formed on the LED to enable a photon arriving at its surface to scatter randomly. Alternatively, the light emitting device is shaped as a truncated inverted pyramid. Furthermore, in another recent method, to form a photonic crystal, the LED surface is patterned such that a photon of a specified wavelength is transmitted or reflected selectively. Also, a thick sapphire substrate can be removed from the LED structure after attaching a metal substrate to the LED structure. For now, the vertical GaN-based LED obtained thereby exhibits the highest extraction efficiency. "Watt-Class High-Output-Power 365 nm Ultraviolet Light-Emitting Diodes" by Daisuke Morita et al. published in Japanese Journal of Applied Physics (Vol. 43, No. 9A, 2004, pp. 5945-5950) discloses a vertical GaN-based LED having a rough pattern on an n-AlGaN contact layer and a manufacturing method thereof.

FIG. 1 is a side sectional view illustrating an example of a conventional vertical group III-nitride light emitting device. Referring to FIG. 1, the conventional group III-nitride light-emitting device 10 includes a conductive adhesive layer 12, a metal reflective layer 13, a p-doped AlGaN contact layer 14, a p-doped AlGaN clad layer 15, an active layer 16 and an n-doped AlGaN contact layer 17 sequentially stacked on a conductive substrate 11. Also, an n-electrode 18 is formed on the n-doped AlGaN contact layer 17.

As shown in FIG. 1, a rough pattern 21 is formed on the n-doped AlGaN contact layer 17 exposed to an outside. A photon which starts from inside the light emitting device 10 and arrives at the rough pattern 21 is scattered in the rough pattern 21, thus more highly likely to exit to the outside. Eventually, despite big refractivity differences between AlGaN material and external environments such as air and epoxy resin, external extraction efficiency can be improved.

However, in the conventional vertical group III-nitride light emitting device 10, to enable sufficient extraction of light through the rough pattern 21, a contact area of the n-electrode 18 becomes a relatively small. Accordingly, current concentrates in a lower part of the n-electrode 18, disadvantageously increasing operating voltage $V_f$ of the light emitting device 10.

Further, to manufacture the conventional vertical group III-nitride light emitting device 10 having the rough pattern 21 requires following processes to be conducted sequentially: growing GaN-based semiconductor 17, 16, 15, 14 on a sapphire substrate (not illustrated), adhering the conductive substrate 11, removing the sapphire substrate and forming the rough pattern 21. In addition, to form the rough pattern 21 requires a photolithography process including wet or dry etching such as inductivity coupled plasma-reactive ion etching (ICP-RIE) on the n-doped AlGaN contact layer 17. However, with the sapphire substrate removed, it is very difficult to perform the photolithography on a top surface of a thin-filmed GaN-based structure having a thickness of 10 μm or less, even though the conductive substrate 11 is used as a supporting substrate. Accordingly, this leads to significant decrease in yield.

SUMMARY OF THE INVENTION

The present invention has been made to solve the foregoing problems of the prior art and it is therefore an object of the present invention to provide a group III-nitride light emitting device considerably improved in light extraction efficiency and operating voltage properties.

It is another object of the invention to provide a method for manufacturing a vertical group III-nitride light emitting device having high extraction efficiency of light in an easy and simple fashion at a greater yield.

According to an aspect of the invention for realizing the object, there is provided a vertical group III-nitride light emitting device comprising: a conductive substrate; a p-type clad layer stacked on the conductive substrate; an active layer stacked on the p-type clad layer; an n-doped layer stacked on the active layer, the n-doped layer having a composition expressed by $Al_xGa_yIn_{1-x-y}N$, where $0 \le x \le 1$, $0 \le y \le 1$ and $0 \le x+y \le 1$; an undoped GaN layer stacked on the n-doped layer; and an n-electrode formed on the undoped GaN layer, wherein the undoped GaN layer has a rough pattern formed on a top surface thereof. Preferably, the undoped GaN layer does not have a rough pattern on an area where the n-electrode is formed.

According to one embodiment of the invention, the vertical group III-nitride light emitting device may further comprise a reflective layer formed between the conductive substrate and the p-type clad layer. Preferably, the reflective layer comprises one selected from a group consisting of a $CuInO_2/Ag$ layer, a $CuInO_2/Al$ layer and an Ni/Ag/Pt layer. Also, the vertical group III-nitride light emitting device may further comprise a transparent electrode layer, such as an indium tin oxide (ITO) layer, formed on the undoped GaN layer.

According to another embodiment of the invention, the vertical group III-nitride light emitting device may further comprise a conductive adhesive layer formed between the conductive substrate and the p-type clad layer. The conductive adhesive layer may comprise one selected from a group consisting of Au, Au—Sn, Sn, In, Au—Ag and Pb—Sn. Moreover, the vertical group III-nitride light emitting device may further comprise a reflective layer between the conductive adhesive layer and the p-type clad layer, which may be selected from a group consisting of a $CuInO_2/Ag$ layer, a $CuInO_2/Al$ layer and an Ni/Ag/Pt layer.

According to further another embodiment of the invention, the conductive substrate may comprise a metal substrate or a silicon substrate. The metal substrate comprises one selected from a group consisting of W, Cu, Ni, Ti and alloys of at least two thereof.

According to a preferred embodiment of the invention, the rough pattern comprises convexes or concaves which are spaced from each other in the range of 20 nm to 100 μm, and each have a width and a height of 20 nm to 100 μm, respectively. More preferably, the rough pattern has convexes or concaves which are spaced from each other in the range of 200 nm to 3 μm, and each have a width and a height of 200 nm to 3 μm, respectively. The rough pattern may comprise a photonic crystal.

According to various embodiments of the invention, the rough pattern may have a relieved or engraved section. The rough pattern may have a sectional shape of hemisphere, rectangle or serration.

According to an aspect of the invention for realizing the object, there is provided a method for manufacturing a vertical group III-nitride light emitting device comprising steps of:

(i) preparing a basic substrate having a rough pattern formed on a top surface thereof;

(ii) forming an n-type clad layer, an active layer and a p-type clad layer sequentially on the basic substrate, the clad layers and the active layer having compositions expressed by $Al_xGa_yIn_{1-x-y}N$, where $0\leq x\leq 1$, $0\leq y\leq 1$, and $0\leq x+y\leq 1$;

(iii) forming a conductive substrate on the p-type clad layer;

(iv) removing the basic substrate so as to expose a rough pattern formed on a bottom surface of the n-type clad layer; and (v) forming an n-electrode on a partial area of the exposed bottom surface of the n-type clad layer.

According to one embodiment of the invention, the basic substrate may comprise one selected from a group consisting of a sapphire substrate, a SiC substrate, a GaN substrate and an AlN substrate. Also, the conductive substrate may comprise a metal substrate or a silicon substrate. The metal substrate may comprise one selected from a group consisting of W, Cu, Ni, Ti and alloys of at least two thereof.

According to a preferred embodiment of the invention, in the step (i), the rough pattern is not formed on a top surface area of the basic substrate corresponding to the n-electrode. Thereby, the n-type clad layer does not have a rough pattern on an area where the n-electrode is formed.

According to another preferred embodiment of the invention, the step (ii) comprise:

forming an undoped GaN layer on the basic substrate; and forming an n-doped layer on the undoped GaN layer, the n-doped layer having a composition expressed by $Al_xGa_yIn_{1-x-y}N$, where $0\leq x\leq 1$, $0\leq y\leq 1$ and $0\leq x+y\leq 1$. In this case, the undoped GaN layer has a rough pattern formed on a top surface thereof.

According to one embodiment of the invention, the step (iii) may comprise bonding the conductive substrate to the p-clad layer via a conductive adhesive layer. According to another embodiment of the invention, the step (iii) may comprise forming the conductive type substrate on the p-type clad layer via plating, deposition or sputtering.

According to a preferred embodiment of the invention, a reflective layer may be formed on the p-type clad layer between the step (ii) and the step (iii). Preferably, the reflective layer comprises one selected from a group consisting of a $CuInO_2/Ag$ layer, a $CuInO_2/Al$ layer and an Ni/Ag/Pt layer. Also, a transparent electrode layer, such as an ITO layer, may be formed on the n-type clad layer after the step (iv).

According to further another preferred embodiment, the rough pattern formed on the basic substrate comprises convexes or concaves which are spaced from each other in the range of 20 nm to 100 μm, and each have a width and a height of 20 nm to 100 μm, respectively. More preferably, the rough pattern formed on the basic substrate has convexes or concaves which are spaced from each other in the range of 200 nm to 3 μm, and each have a width and a height of 200 nm to 3 μm, respectively. The rough pattern formed on the n-type clad layer may comprise a photonic crystal.

According to various embodiments, the step (i) is conducted such that the rough pattern has a sectional shape of hemisphere, rectangle or serration.

As used herein, the term 'group III-nitride' is defined as a binary, ternary or quaternary compound semiconductor having a composition expressed by $Al_xGa_yIn_{1-x-y}N$, where $0\leq x\leq 1$, $0\leq y\leq 1$, and $0\leq x+y\leq 1$. Also, 'a group III-nitride light emitting device' means that an n-type clad layer, active layer and p-type clad layer constituting the light emitting structure are made of the group III-nitride.

BRIEF DESCRIPTION OF THE DRAWINGS

The above and other objects, features and other advantages of the present invention will be more clearly understood from the following detailed description taken in conjunction with the accompanying drawings, in which.

DETAIL LIGHT EMITTING DEVICE DESCRIPTION OF THE PREFERRED EMBODIMENT

Figure 1:
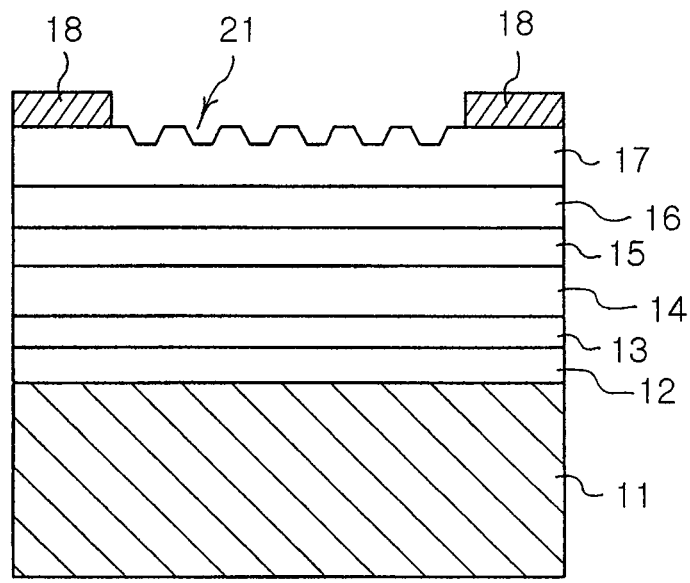
FIG. 1 is a side sectional view illustrating an example of a conventional vertical group III-nitride light emitting device.

The present invention now will be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signals are used to designate the same or similar components throughout.

Figure 2:
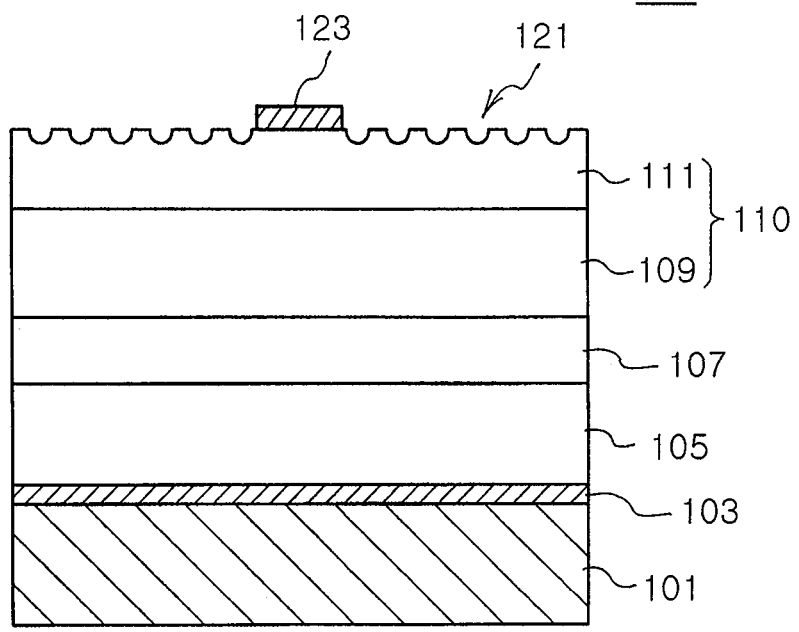
FIG. 2 is a side sectional view illustrating a group III-nitride light emitting device according to one embodiment of the invention.

FIG. 2 is a side sectional view illustrating a vertical group III-nitride light emitting device according to one embodiment of the invention. Referring to FIG. 2, the light emitting device 100 includes a reflective layer 103, a p-type clad layer 105, an active layer 107, an n-doped $Al_xGa_yIn_{1-x-y}N$ ($0 \le x \le 1$, $0 \le y \le 1$, $0 \le x+y \le 1$) layer 109, and an undoped GaN layer 111 sequentially stacked on a conductive substrate 101. The n-doped $Al_xGa_yIn_{1-x-y}N$ layer 109 and undoped GaN layer 111 constitute an n-type clad layer 110. The p-type and n-type clad layers 105, 110 and the active layer 107 are made of group III-nitride having compositions of $Al_mGa_nIn_{1-m-n}N$, where $0 \le m \le 1$, $0 \le n \le 1$ and $0 \le m+n \le 1$. The active layer 107 may have a multiple quantum well structure. An n-electrode 123 is formed on a top surface of the undoped GaN layer 111. The n-electrode 123 is positioned in an upper part of the light emitting device 100, and a lower part of the light emitting device 100, that is, the conductive substrate 101 is employed as a p-electrode. This constitutes a vertical light emitting device having electrodes at opposed sides.

The conductive substrate 101 is made of one selected from a group consisting of silicon (Si), tungsten (W), copper (Cu), nickel (Ni), Titan (Ti) and alloys of at least two thereof. This conductive substrate 101 is adhered under the p-type clad layer 105 by a bonding process using a conductive adhesive layer stated later. Alternatively, the conductive substrate 101 is provided under the p-clad layer 105 via plating, deposition or sputtering conducted on an exposed surface of the p-type clad layer 105.

As shown in FIG. 2, the undoped GaN layer 11 has a rough pattern 121 formed on a top surface thereof except the area where the n-electrode 123 is formed. This rough pattern 121 allows easy extraction of a photon generated inside the light emitting device 100. That is, light reaching the top surface of the layer 111 is scattered by the rough pattern 121, thereby easily extracted out of the light emitting device 100. Particularly, the area where the n-electrode 123 is formed is free of the rough pattern 121, thus preventing increase in contact resistance between the undoped GaN layer 111 and the n-electrode 123.

As described later, to form the rough pattern 121, a rough pattern formed on other basic substrate (e.g. a sapphire substrate) is transferred to the undoped GaN layer 111. Therefore, the rough pattern 121 can be regularly formed at precise dimensions. To ensure a sufficient scattering effect, preferably, the rough pattern 121 includes convexes or concaves which are spaced from each other in the range of 20 nm to 100 μm, and each have a width and a height of 20 nm to 100 μm, respectively. More preferably, the convexes or concaves are spaced from each other in the range of 200 nm to 3 μm, and each have a width and a height of 200 nm to 3 μm, respectively. To form a photon crystal, the convexes or concaves of the rough pattern 121 are spaced from each other at 3 μm or less and each are sized 3 μm or less. This photon crystal can refract light by a law of refraction, not a law of reflection. Thus, this significantly enhances external extraction efficiency of light. The rough pattern 121 has a section formed by relief or intaglio and has various sectional shapes such as hemisphere, rectangle and serration.

The reflective layer 103 enables light to be reflected upward in a light exiting direction, thereby boosting external extraction of the light. Preferably, the reflective layer 103 is selected from a group consisting of a $CuInO_2/Ag$ layer, a $CuInO_2/Al$ layer and an Ni/Ag/Pt layer. Although not illustrated in FIG. 2, a transparent electrode layer made of ITO may be formed on the rough-patterned undoped GaN layer 111. The transparent electrode layer allows the light to exit at a uniform intensity.

According to the embodiment of the invention, a vertical group III-nitride light emitting device 100 includes an undoped GaN layer 111 between an n-doped $Al_xGa_yIn_{1-x-y}N$ layer 109 and an n-electrode 123. The undoped GaN layer 111 is positioned under the n-electrode 123 to prevent a current concentration generated directly under the n-electrode 123. That is, the undoped GaN layer 111 functions to spread current so that current generated by voltage applied from the n-electrode 123 is spread sideward extensively. This reduces operating voltage $V_f$ of the light emitting device 100 and enhances electrostatic discharge properties, thereby lengthening lifetime of the light emitting device 100.

Also, according to the embodiment of the invention, an n-type clad layer 110 has a rough pattern 121 formed on a top surface thereof to improve external extraction efficiency of the light. Especially, the rough pattern 121 can include convexes or concaves which are spaced from each other at 3 μm or less, and each have a width and a height of 3 μm or less. Such a rough pattern gives a photonic crystal to the surface of the device 100. The photonic crystal considerably boosts external extraction efficiency of the light.

Figure 3:
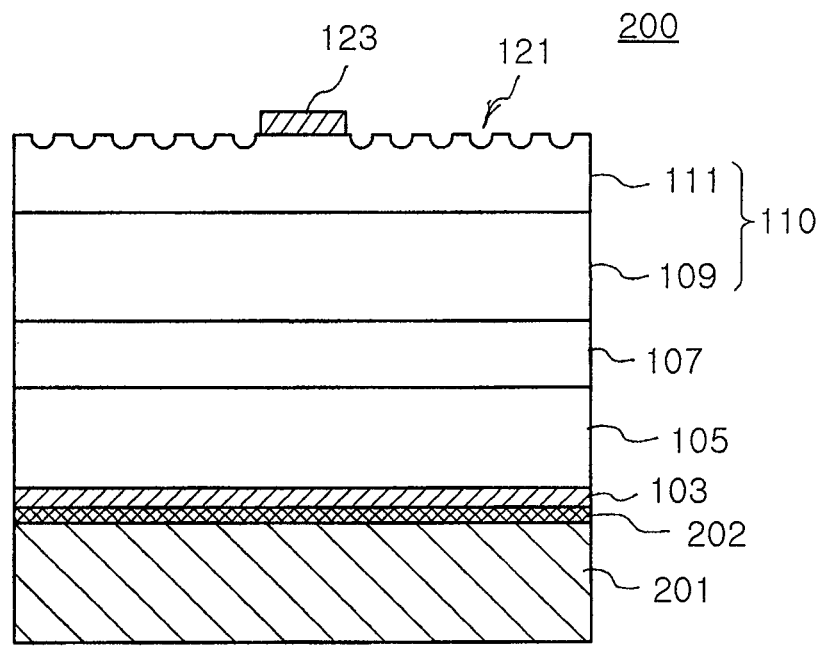
FIG. 3 is a side sectional view illustrating a group III-nitride light emitting device according to another embodiment of the invention.

FIG. 3 is a side sectional view illustrating a group III-nitride light emitting device 200 according to another embodiment of the invention. The light emitting device 200 of FIG. 3 includes a conductive substrate 201 adhered by a conductive adhesive layer 202. Referring to FIG. 3, a conductive adhesive layer 202, a reflective layer 103, a p-type clad layer 105, an active layer 107, an n-doped $Al_xGa_yIn_{1-x-y}N$ layer 109, and an undoped GaN layer 111 are sequentially stacked on a conductive substrate 201. An n-electrode 123 is formed on the undoped GaN layer 111. The undoped GaN layer 111 has a rough pattern 121 formed on the top surface thereof. The conductive adhesive layer 202 is selected from a group consisting of Au, Au—Sn, Sn, In, Au—Ag and Pb—Sn. The conductive adhesive layer 202 adheres the conductive substrate 201 such as a silicon substrate to an $Al_xGa_yIn_{1-x-y}N$-based light emitting structure. Constituents other than the conductive adhesive layer 202 are identical to those in the embodiment stated above and thus will not be explained in further detail.

A method for manufacturing a light emitting device according to the invention will be described hereinafter. FIGS. 4 to 10 are sectional views for explaining the method for manufacturing the light emitting device according to one embodiment of the invention.

Figure 4:
FIGS. 4 to 10 are sectional views for explaining a method for manufacturing a vertical group III-nitride light emitting device according to one embodiment of the invention.

First, referring to FIG. 4, a substrate 151 (hereinafter, "a basic substrate") is prepared to grow a group III-nitride semiconductor layer. The basic substrate 151, for example, may be a sapphire substrate. Alternatively, the basic substrate 151 may be a SiC, GaN or AlN substrate.

Figure 5:
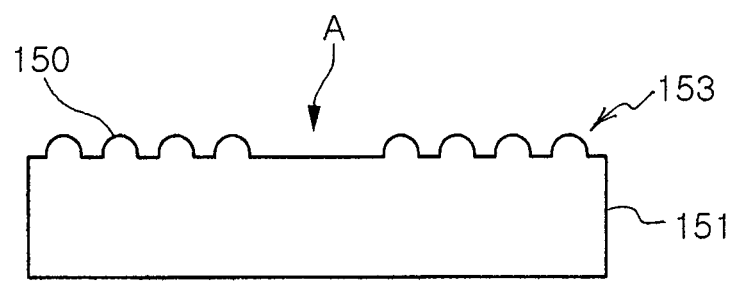

Thereafter, as shown in FIG. 5, a rough pattern 153 having hemispherical relieves 150 is formed on the basic substrate 151. To form the rough pattern 153, for example, a top surface of the basic substrate 151 is selectively etched via a reflowed photoresist pattern. Unlike a conventional technique, the rough pattern 153 is formed on "the substrate 151" such as a sapphire substrate. This allows easy formation of the rough pattern 153, and enables the rough pattern 153 to be formed at precise dimensions and at regular intervals.

Figure 11:
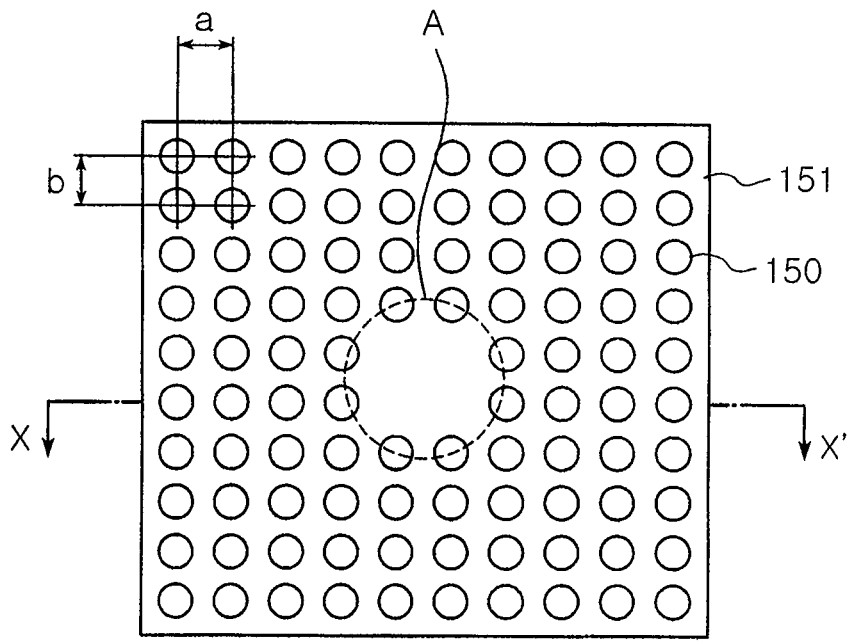
FIG. 11 is a top view illustrating a rough pattern formed on a top surface of the substrate of FIG. 5.

FIG. 11 is a top view illustrating a rough pattern 153 formed on a top surface of the basic substrate 151 of FIG. 5, which is a side sectional view cut along the line XX' of FIG. 11. As shown in FIGS. 5 and 11, the rough pattern 153 is not formed on a partial area A of a top surface of the basic substrate 151. The area A with no rough pattern formed thereon corresponds to an area where an n-electrode will be formed later. As stated later, since the area A is free of the rough pattern 153, increase in contact resistance of the n-electrode is prevented.

The rough pattern 153 includes convexes or concaves which are spaced from each other in the range of 20 nm to 100 µm, and each have a width and a height of 20 nm to 100 µm. Preferably, the convexes or concaves are spaced from each other in the range of 200 nm to 3 µm, and each have a width and a height of 200 nm to 3 µm. For example, the rough pattern 153 having the convexes or concaves spaced from each other at 3 µm or less is formed on the basic substrate 151 so that a photonic crystal may be formed on the top surface of the n-clad layer to be formed later.

Figure 17:
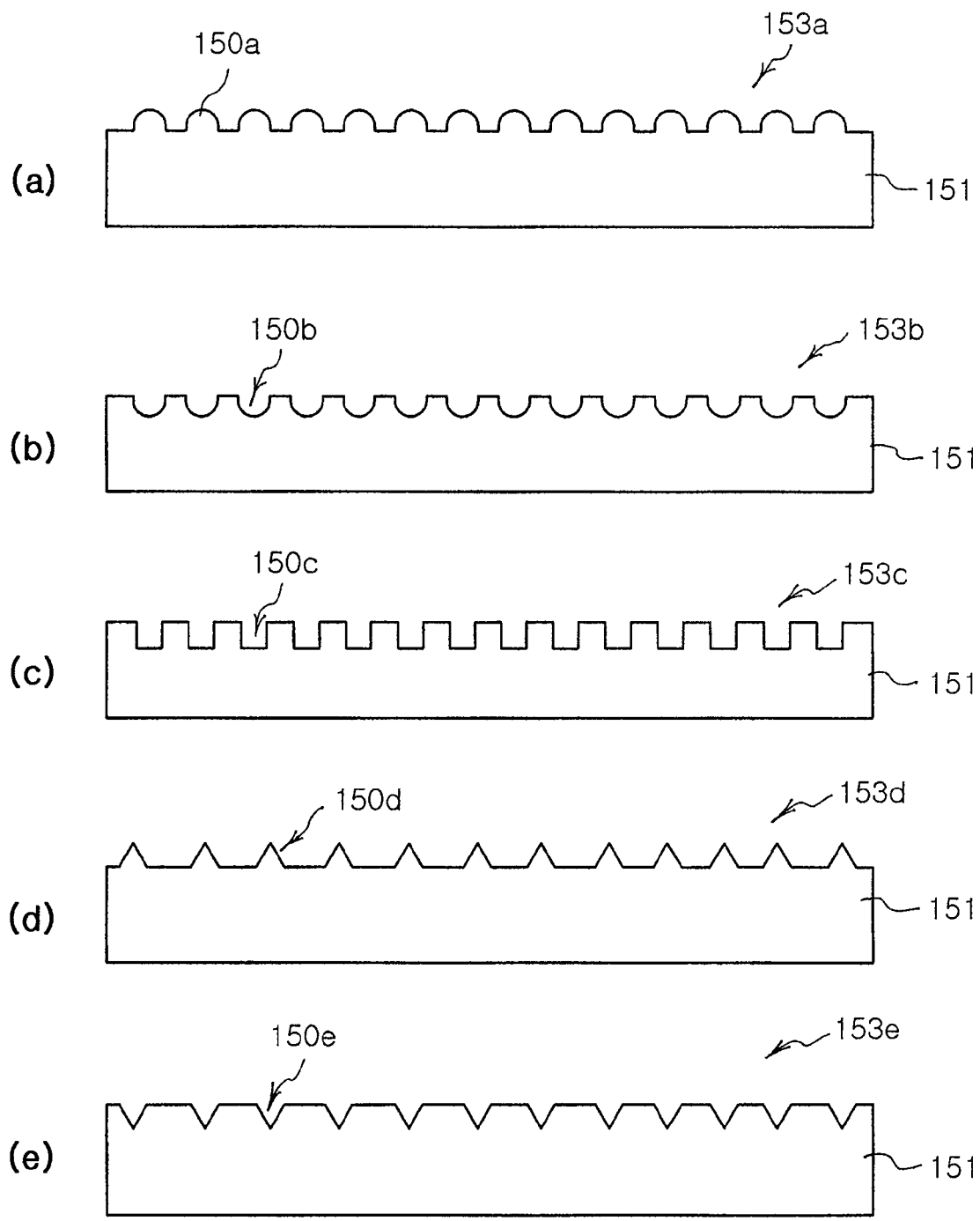
FIG. 17 is a sectional view illustrating various types of rough patterns formed on a top of a basic substrate according to the invention.

According to the embodiment of the invention, the rough pattern 153 has a hemispherical sectional shape but may be shaped differently. As illustrated in FIGS. 17 (a) to (e), on a top surface, the basic substrate 151 may have the rough pattern 153 in a variety of shapes such as a rough pattern 153a with hemispherical relieves 150a, a rough pattern 153b with hemispherical intaglios 150b, a rough pattern 153c with rectangular intaglios 150c, a rough pattern 153d with serrated relieves 150d and a rough pattern 153e with serrated intaglios 150e.

Figure 6:
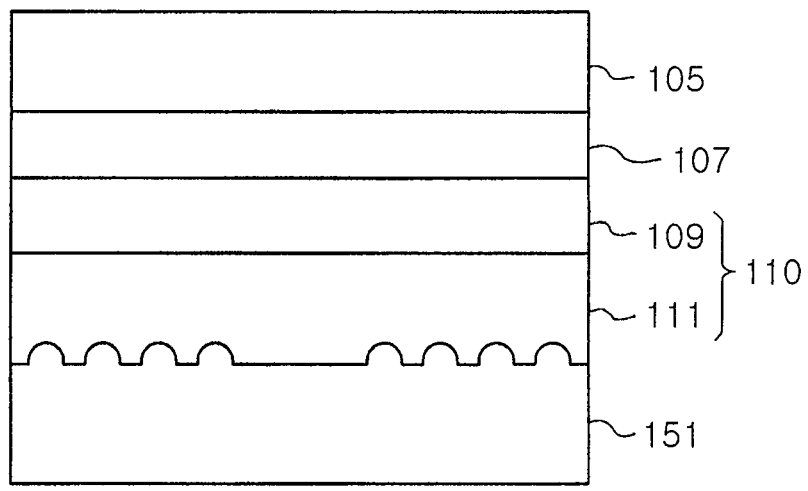

Then, referring to FIG. 6, an undoped GaN layer 111, an n-doped $Al_xGa_yIn_{1-x-y}N$ layer 109, an active layer 107, a p-type clad layer 105 are sequentially grown on the basic substrate 151 having the rough surface pattern 153. As a result, a light emitting structure is formed, including the clad layers 110, 105 and the active layer 107. The undoped GaN layer 111 is grown on a top surface of the basic substrate 151 having the rough pattern 153 so that the rough pattern 153 is transferred to a surface of the undoped GaN layer 111 contacting the basic substrate 151. Consequently, a rough pattern (see the reference numeral 121 of FIG. 9) is formed on an underside of the undoped GaN layer 111. The rough pattern 121 formed on the undoped GaN layer 111 has convexes or concaves spaced from each other at a distance substantially identical to that of the concaves or convexes of the rough pattern 153 formed on the basic substrate 151. Also, the convexes or concaves of the rough pattern 121 formed on the undoped GaN layer 111 each have a width and a height substantially identical to those of the concaves or convexes of the rough pattern 153 formed on the basic substrate 151. As explained above with reference to FIGS. 5 and 11, the rough pattern 153 of the basic substrate 151 is not formed on the area corresponding to an n-electrode (the area A of FIGS. 5 and 11). Accordingly, the rough pattern 121 of the undoped GaN layer 111 is not formed on this area either.

In a manufacturing method according to the embodiment of the invention, an undoped GaN layer 111 and an n-doped $Al_xGa_yIn_{1-x-y}N$ layer 109 constitute an n-type clad layer 110. However, only the n-doped $Al_xGa_yIn_{1-x-y}N$ layer 109 may constitute the n-type clad layer without the undoped GaN layer 111. In such a case, the rough pattern 153 of the basic substrate may be transferred to an underside of the n-doped $Al_xGa_yIn_{1-x-y}N$ layer 109.

Figure 7:
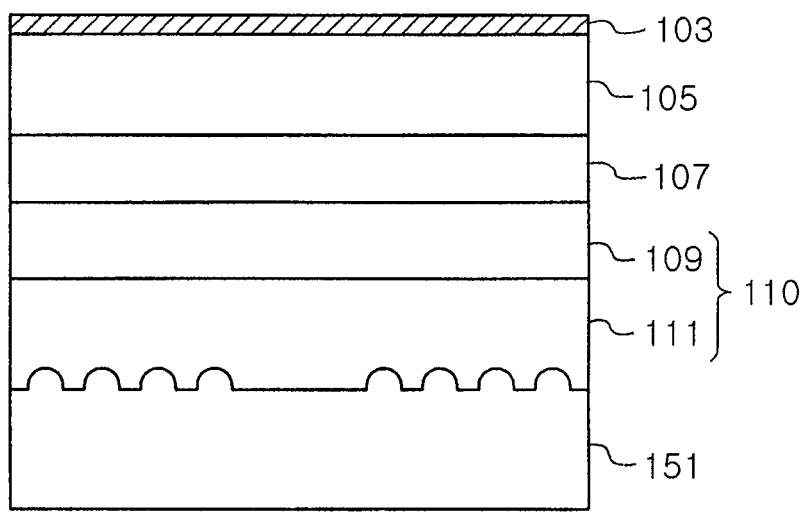
Figure 8:
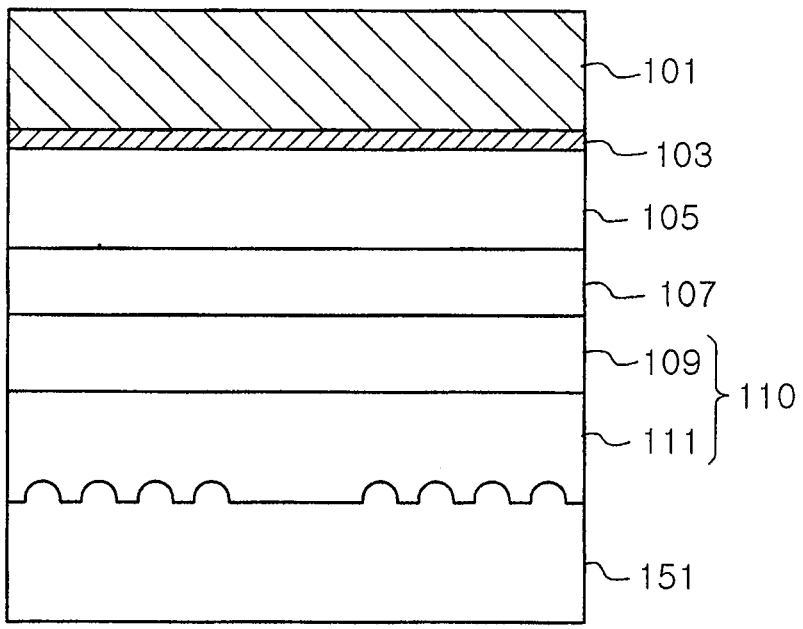

Then, as shown in FIG. 7, a reflective layer 103 made of e.g. a $CuInO_2$/Ag layer, a $CuInO_2$/Al layer or an Ni/Ag/Pt layer is formed on a p-type clad layer 105. The reflective layer reflects light toward a light exiting surface, thereby enhancing light extraction efficiency. Then, as shown in FIG. 8, a conductive substrate 101 selected from a group consisting of W, Cu, Ni and alloys of at least two thereof is formed on the reflective layer 103. The metal conductive substrate 101, for example, can be provided via plating, deposition or sputtering. In an alternative embodiment, the conductive substrate 101 may be formed on the p-type clad layer 105 without the reflective layer.

Figure 9:
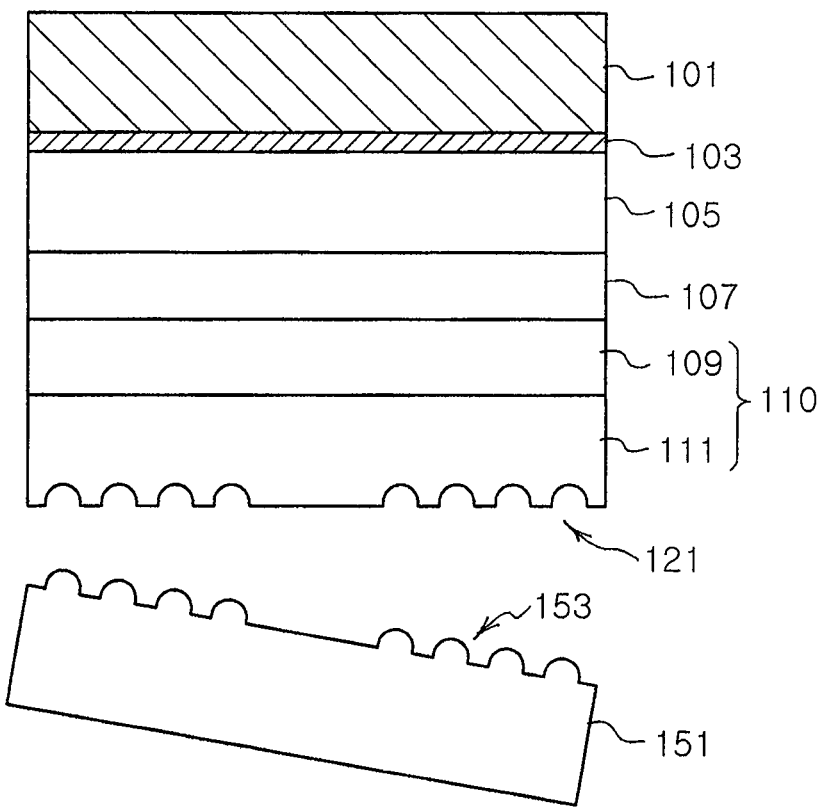

Next, referring to FIG. 9, the basic substrate 151 is removed from a light emitting structure. The basic substrate 151, for example, can be removed by a laser lift-off process using a laser beam. Accordingly, as shown in FIG. 9, the rough pattern formed on the bottom surface of the undoped GaN layer 111 is exposed.

Figure 10:
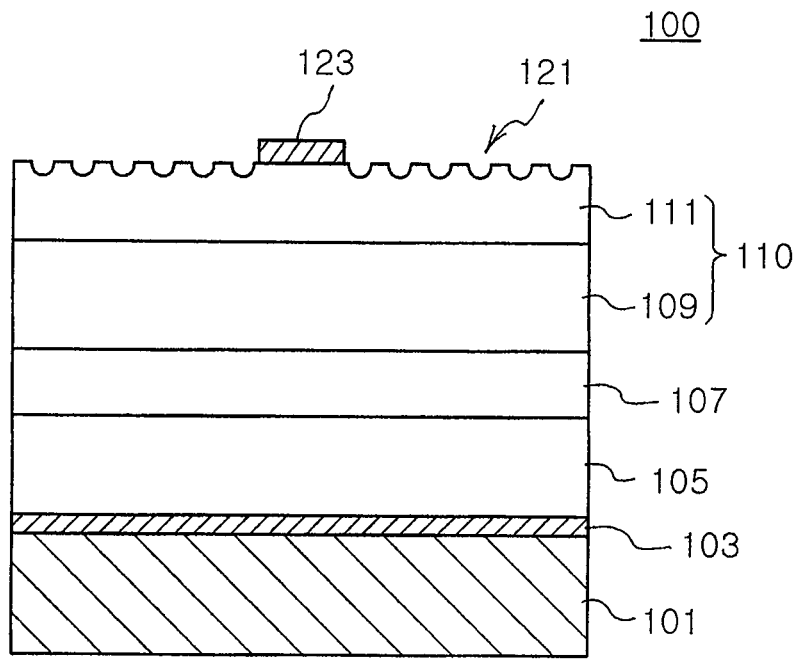

Then, as shown in FIG. 10, an n-electrode 123 is formed on a partial area of the exposed surface of the undoped GaN layer 111. Therefore, the light emitting device 100 according to the embodiment of the invention is acquired. It should be noted that the partial area where the n-electrode is formed is free of the rough pattern 121. If the n-electrode 123 is formed on the rough-patterned surface, contact resistance of the n-electrode is increased. Therefore, it is desirable to form the n-electrode 123 on an area without the rough pattern 121 in order to prevent increase in contact resistance. Before forming the n-electrode 123, a transparent electrode (not illustrated) made of ITO may be formed on the exposed surface of the undoped GaN layer 111.

Figure 12:
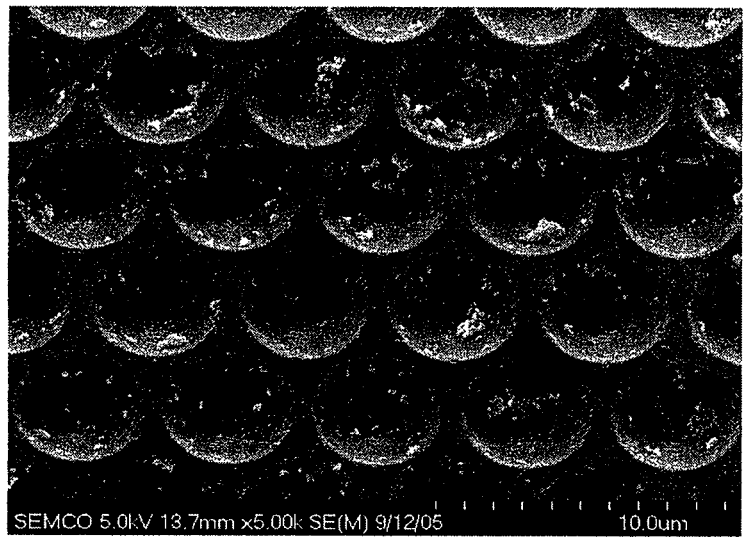
FIG. 12 is a SEM picture illustrating a rough pattern formed on a top surface of the vertical group III-nitride light emitting device according to the embodiment of the invention.
Figure 13:
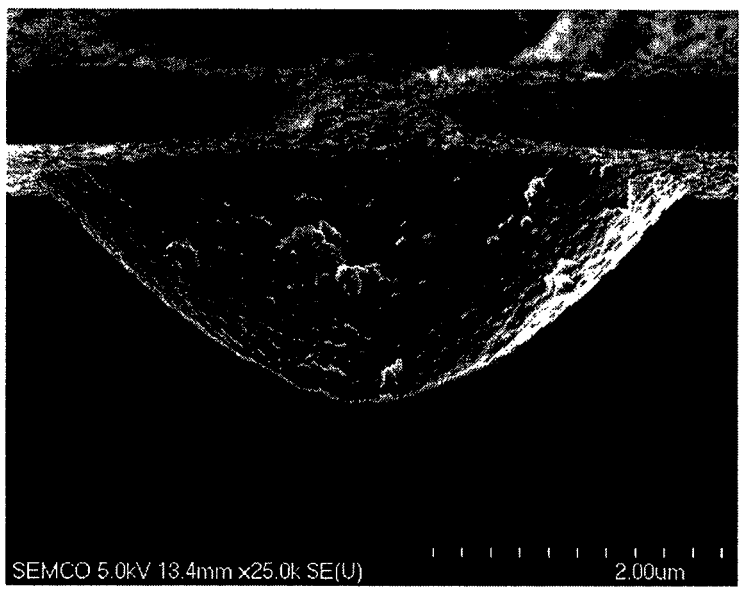
FIG. 13 is a magnification of the rough pattern of FIG. 12.

FIG. 12 is a SEM picture illustrating the rough pattern 121 formed on a top surface of the undoped GaN layer 111. FIG. 13 is a SEM picture illustrating a magnified rough pattern of FIG. 12. As shown in FIGS. 12 and 13, the rough pattern 121 formed on the undoped GaN layer 111 has a clearly defined shape and a regular interval. It is relatively easy to form the rough pattern 153 with precise dimensions on the basic substrate 151 such as a sapphire substrate, thereby leading to easy formation of the rough pattern 121 with precise dimensions on the undoped GaN layer 111. This consequently boosts yield.

Figure 14:
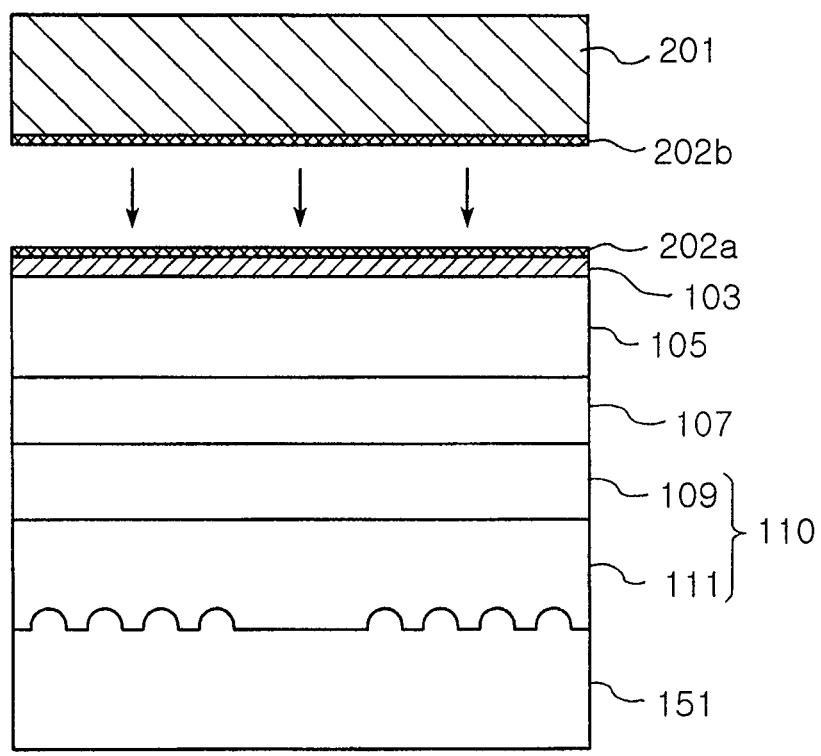
FIGS. 14 to 16 are sectional views for explaining a method for manufacturing a vertical group III-nitride light emitting device according to another embodiment of the invention.
Figure 15:
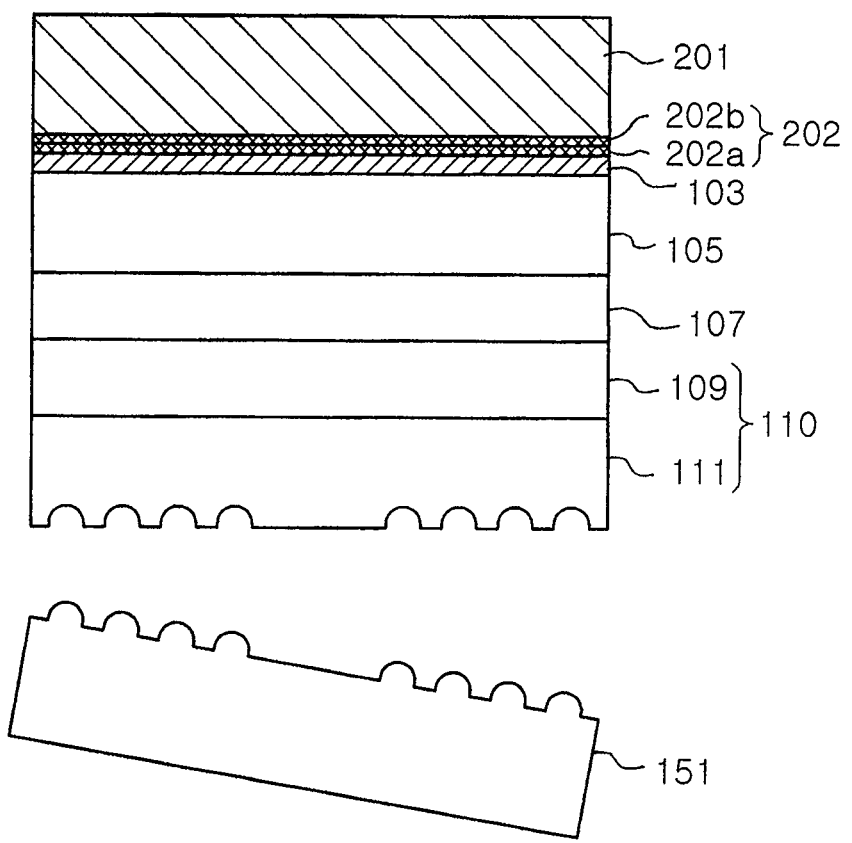
Figure 16:
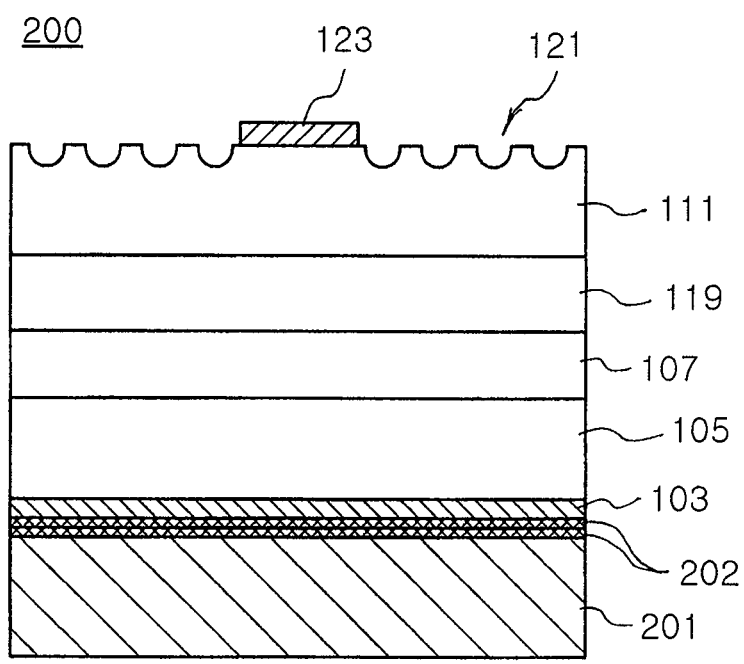

FIGS. 14 to 16 are sectional views for explaining a method for manufacturing a group III-nitride light emitting device according to another embodiment of the invention. In this embodiment, a conductive substrate is bonded to a p-type clad layer via a conductive adhesive layer. This embodiment also goes through processes explained above with reference to FIGS. 4 to 7.

Then, as shown in FIG. 14, conductive adhesive layers 202a and 202b are formed on an exposed surface of the reflective layer 103 and on a corresponding area of the conductive substrate 201. A metal substrate or a silicon substrate may be used as the conductive substrate 201. As the adhesive layer 202a, 202b, for example, gold (Au) is used. Alternatively, Au—Sn, Sn, In, Au—Ag or Pb—Sn may be adopted for the adhesive layer. Then, the conductive substrate 201 is adhered to the reflective layer 103 via the conductive adhesive layers 202a and 202b. This enables bonding between the conductive substrate 201 and the light emitting structure. In this embodiment, the conductive adhesive layer is formed both on the conductive substrate 201 and the light emitting structure. However, the conductive adhesive layer may be formed on either the conductive substrate 201 or the light emitting structure. The reflective layer 103 may not be provided.

Then, as shown in FIG. 15, the basic substrate 151 is removed, thereby exposing the rough pattern formed on the undoped GaN layer 111. Then, as shown in FIG. 16, an n-electrode 123 is formed on an undoped GaN layer 111 to complete the light emitting device 200. According to this embodiment, the conductive substrate 201 prepared in advance is adhered to the light emitting structure via the conductive adhesive layer 202. This obviates a need for plating, deposition or sputtering required to form the conductive substrate 201. Also, a silicon substrate may used as the conductive substrate 201.

As set forth above, according to the invention, an undoped GaN layer having a rough pattern formed thereon is positioned under an n-electrode to produce a group III-nitride light emitting device improved in light extraction efficiency and operating voltage. Also, according to a manufacturing method of the invention, a rough pattern formed on a basic substrate is transferred to an n-type clad layer, thereby ensuring easy manufacture of a vertical group III-nitride light emitting device having high extraction efficiency at a higher yield.

While the present invention has been shown and described in connection with the preferred embodiments, it will be apparent to those skilled in the art that modifications and variations can be made without departing from the spirit and scope of the invention as defined by the appended claims.

What is claimed is:

1. A method for manufacturing a vertical group III-nitride light emitting device comprising steps of:
   (i) preparing a basic substrate having a rough pattern formed on a top surface thereof;
   (ii) forming an n-type clad layer, an active layer and a p-type clad layer sequentially on the basic substrate, the clad layers and the active layer having compositions expressed by $Al_xGa_yIn_{1-x-y}N$, where $0 \leq x \leq 1$, $0 \leq y \leq 1$, and $0 \leq x+y \leq 1$;
   (iii) forming a conductive substrate on the p-type clad layer;
   (iv) removing the basic substrate so as to expose a rough pattern formed on a bottom surface of the n-type clad layer; and
   (v) forming an n-electrode on a partial area of the exposed bottom surface of the n-type clad layer,
   wherein the basic substrate consists of a single material, the n-type clad layer is grown in direct, physical contact with a top surface of the basic substrate, and at least a part of the n-type clad layer is grown in an area of the top surface of the basic substrate in which the rough pattern is not formed.

2. The method according to claim 1, wherein the basic substrate comprises one selected from a group consisting of sapphire, SiC, GaN and AlN.

3. The method according to claim 1, wherein the step (iii) comprises bonding the conductive substrate to the p-clad layer via a conductive adhesive layer.

4. The method according to claim 1, wherein the step (iii) comprises forming the conductive substrate on the p-type clad layer via plating, deposition or sputtering.

5. The method according to claim 1, further comprising forming a reflective layer on the p-type clad layer between the step (ii) and the step (iii).

6. The method according to claim 5, wherein the reflective layer comprises one selected from a group consisting of a $CuInO_2$/Ag layer, a $CuInO_2$/Al layer and an Ni/Ag/Pt layer.

7. The method according to claim 1, further comprising forming a transparent electrode layer on the n-type clad layer after the step (iv).

8. The method according to claim 1, wherein the rough pattern formed on the basic substrate comprises convexes or concaves which are spaced from each other in the range of 20 nm to 100 µm, and each have a width and a height of 20 nm to 100 µm, respectively.

9. The method according to claim 1, wherein the rough pattern formed on the basic substrate comprises convexes or concaves which are spaced from each other in the range of 200 nm to 3 µm, and each have a width and a height of 200 nm to 3 µm, respectively.

10. The method according to claim 1, wherein the step (i) is conducted such that the rough pattern has a sectional shape of hemisphere, rectangle or serration.

11. The method according to claim 1, wherein in step (i), the rough pattern is not formed on a top surface area of the basic substrate corresponding to the n-electrode.

12. The method according to claim 1, wherein step (ii) comprises:
   forming an undoped GaN layer on the basic substrate; and
   forming an n-doped layer on the undoped GaN layer, the n-doped layer having a composition expressed by $Al_xGa_yIn_{1-x-y}N$, where $0 \leq x \leq 1$, $0 \leq y \leq 1$, and $0 \leq x+y \leq 1$.

* * * * *